(12) United States Patent
Kim et al.

(10) Patent No.: US 6,329,294 B1
(45) Date of Patent: Dec. 11, 2001

(54) METHOD FOR REMOVING PHOTORESIST MASK USED FOR ETCHING OF METAL LAYER AND OTHER ETCHING BY-PRODUCTS

(75) Inventors: Tae-ryong Kim; Jae-pil Kim; Jong-sik Won; Ka-soon Yim, all of Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/475,188

(22) Filed: Dec. 30, 1999

(30) Foreign Application Priority Data

May 4, 1999 (KR) ................................. 99-16007

(51) Int. Cl.[7] ................................................ H01L 21/302
(52) U.S. Cl. ............................................................ 438/710
(58) Field of Search ............................................. 438/710

(56) References Cited

U.S. PATENT DOCUMENTS 4,812,201   3/1989   Sakai et al. .................... 156/643
4,845,053   7/1989   Zajac ............................. 437/229
5,545,289 * 8/1996   Chen et al. .................... 156/643.1

* cited by examiner

*Primary Examiner*—Robert Kunemund
*Assistant Examiner*—Matthew Anderson
(74) *Attorney, Agent, or Firm*—Volentine Francos, P.L.L.

(57) ABSTRACT

A photoresist mask removing method for effectively removing polymers produced as by-products during etching of a metal layer includes processing the polymers prior to removal to facilitate removal thereof. To remove the photoresist mask remaining on a semiconductor substrate after the metal layer is dry-etched in an etching chamber, the semiconductor substrate is preferably conveyed from the etching chamber to an ashing chamber without vacuum break. The semiconductor substrate is pretreated by supplying $N_2$ gas into the ashing chamber under the vacuum state without applying RF power to the ashing chamber to blow the $N_2$ gas on the semiconductor substrate heated up to a predetermined temperature. This pretreatment modifies the polymer by-products to facilitate removal thereof during ashing. The photoresist mask and the polymer by-products are removed by ashing in the ashing chamber.

20 Claims, 7 Drawing Sheets

METHOD FOR REMOVING PHOTORESIST MASK USED FOR ETCHING OF METAL LAYER AND OTHER ETCHING BY-PRODUCTS

CROSS-REFERENCES TO RELATED APPLICATIONS

The present application claims priority under 35 U.S.C. §119 to Korean Patent Application No. 99-16007 filed on May 4, 1999, the entire contents of which are hereby incorporated by reference for all purposes.

BACKGROUND OF THE INVENTION

1. Field of the Invention

The present invention relates to a method for fabricating semiconductor devices, and more particularly, to a method for removing a photoresist mask used for etching of a metal layer on a wafer as well as other etching by-products.

2. Description of the Related Art

As design rules required for fabrication of high-integrated semiconductor devices become tighter, high density plasma (HDP) equipment is employed as etching equipment when forming a metal pattern on a wafer by a photolithography and dry etch in order to achieve high throughput in case of mass-production.

Compared with medium density plasma (MDP) etching equipment, the HDP etching equipment operates at lower pressure with higher Radio Frequency (RF) power supply, thereby increasing the density of plasma and etching efficiency. When etching a metal layer using the HDP etching equipment, hard polymer which is a by-product of the etching is produced in great quantity. Such production of a great quantity of hard polymer particularly happens at edges of the wafer.

For example, in the HDP having the density of plasma of about $10^{13}/mm^3$, the density of ion or electron is larger, as compared with the MDP etching equipment having the density of plasma of about $10^{11}/mm^3$ or less. Accordingly, stronger energy is applied to a layer to be etched, as compared with the MDP etching equipment. The polymer as a by-product of etching which has been produced under the situation where such high energy is applied, adheres with a high bond energy to the side wall of a metal layer pattern and the side wall of a photoresist mask remaining on the metal layer pattern, thus forming hard polymer which cannot be decomposed at an energy less than the bond energy.

To remove the photoresist mask and other by-products of etching remaining on the metal layer pattern after the etching of the metal layer, generally, an ashing process is carried out under the atmosphere of oxygen or the atmosphere of a gas containing oxygen. Consequently, the interior of an ashing chamber is in the atmosphere of oxygen at a stabilization step for introducing the ashing process. Conventionally, the ashing process performed in the oxygen atmosphere comes immediately after the etching of the metal layer.

During the etching of the metal layer, particularly, the etching for forming an aluminum wire, chlorine gases such as $BCl_3$, $SiCl_4$, and $Cl_2$ are used. Accordingly, by-products of the etching, such as C, Ti, Al, Si, $Al_xCl_y$, $Al_xC_y$, $Ti_xCl_y$ and $Ti_xC_y$, remain on the surface of the wafer immediately after the etching process. When the ashing process in the oxygen atmosphere is performed immediately after the etching process, as in the conventional technique, the by-products remaining on the wafer after the etching as mentioned above are exposed to the oxygen atmosphere so as to be oxidized in the interior of the ashing chamber during the stabilization step for introducing the ashing process. The oxidized by-products of the etching exist in the form of CO, $CO_x$, $Al_xO_y$, $Al_xCl_yO_z$, $Al_xC_yO_z$, $Ti_xO_y$ and $Ti_xCl_yO_z$ and form the hard polymer which cannot be removed during the ashing and strip processes.

Figure 1A:
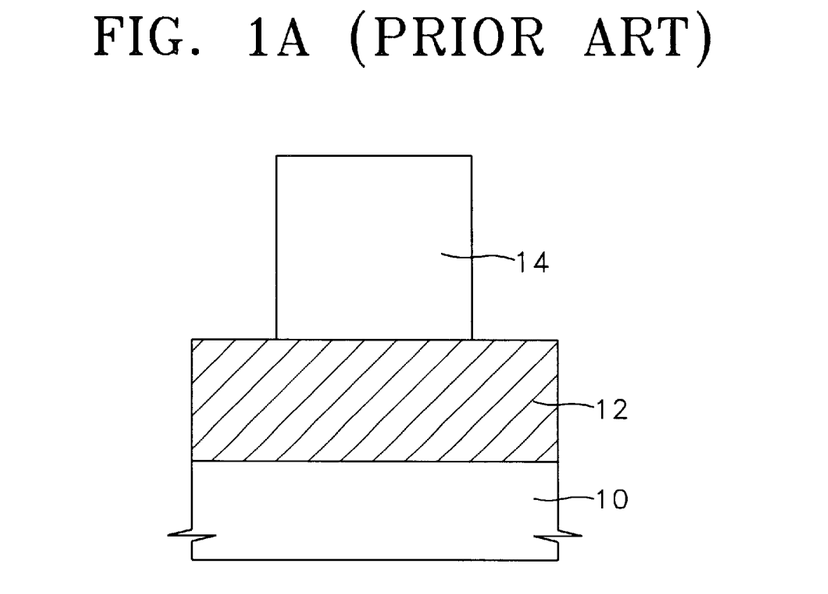
FIGS. 1A, 1B, 1C are sectional views for explaining a conventional method for removing a photoresist mask.
Figure 1B:
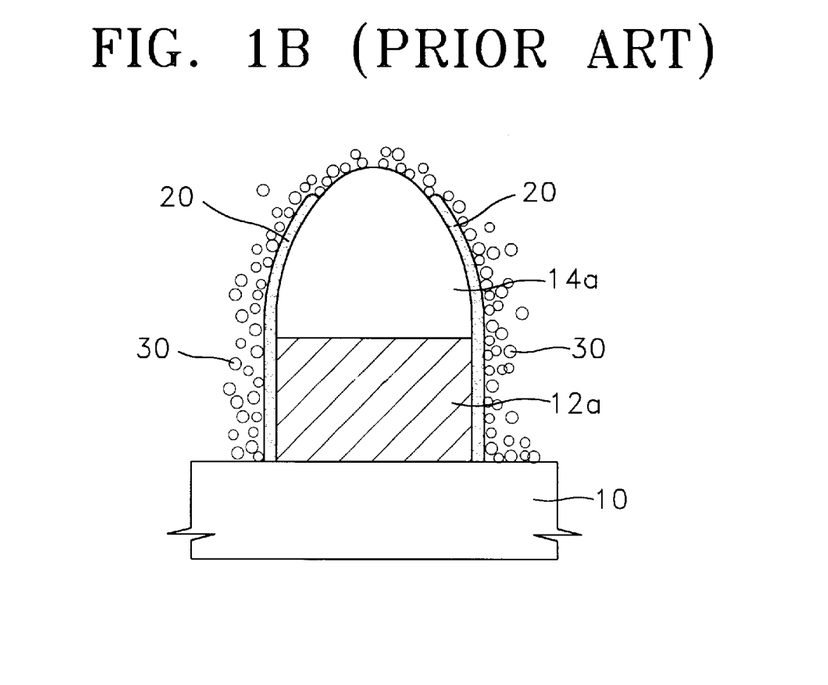
Figure 1C:
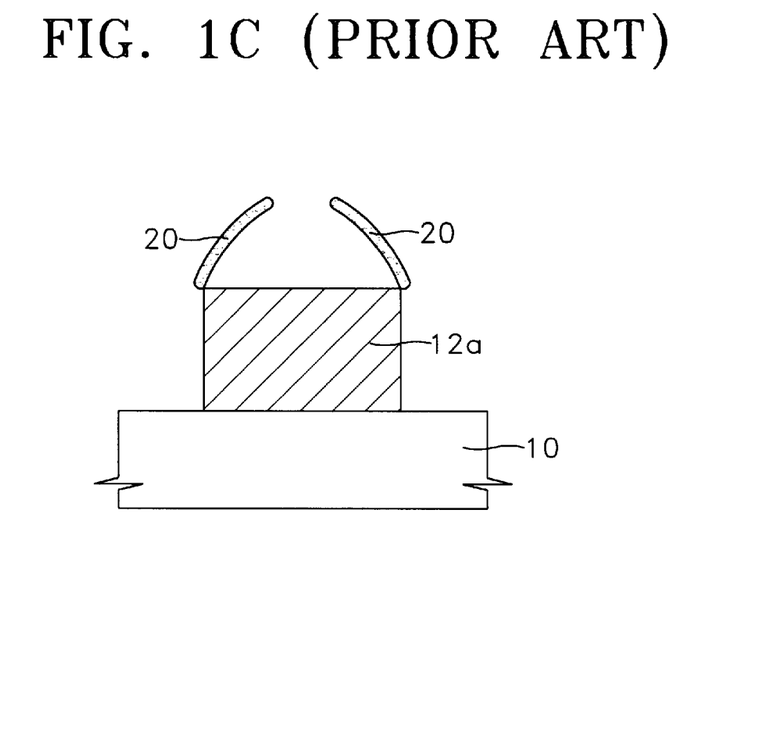

FIGS. 1A to 1C are sectional views which illustrate what occurs when the metal layer is dry-etched using a photoresist mask and then the photoresist mask is removed by the ashing and strip processes according to the prior art. Referring to FIGS. 1A and 1B, when a metal layer 12, e.g., an aluminum layer, on a semiconductor substrate 10 is dry-etched using a photoresist mask 14 in the HDP etching equipment, hard polymer 20 is formed as a by-product of the etching and adheres to the side wall of a metal layer pattern 12a and the side wall of a photoresist mask 14a remaining on the metal layer pattern 12a. Additional etching by-products, which act as sources for forming the polymer, remain around the hard polymer 20. These additional etching by-products, such as substances 30 (hereinafter, called "a polymer source 30"), typically including, e.g., C, Ti, Al, Si, $Al_xCl_y$, $Al_xC_y$, $Ti_xCl_y$ and $Ti_xC_y$, are physically adsorbed to the hard polymer 20.

In case that the wafer with the hard polymer 20 and the polymer source 30 on the semiconductor substrate 10 is moved into the ashing chamber and then goes through the ashing and strip processes according to the prior art as mentioned above, the hard polymer 20 and the polymer source 30 remaining around the hard polymer 20 in the physically adsorbed state are exposed to the oxygen atmosphere and oxidized into CO, $CO_x$, $Al_xO_y$, $Al_xCl_yO_z$, $Al_xC_yO_z$, $Ti_xO_y$, $Ti_xCl_yO_z$ and the like in the ashing chamber at the stabilization step performed prior to the ashing of the photoresist mask 14a. Among the oxidized substances noted above, many have very high evaporation points, particularly, $Al_xCl_yO_z$, $Al_xC_yO_z$ and $Ti_xO_y$, which have evaporation points of 192° C., 2100° C. and 579° C., respectively. Accordingly, the hard polymer 20 adhering to the side wall of the metal layer pattern 12a and the side wall of the photoresist mask 14a becomes difficult to remove by the conventional ashing and strip methods.

As a result, after the ashing and strip processes, the hard polymer 20 on the side wall of the photoresist mask 14a is not removed and remains on the metal layer pattern 12a as shown in FIG. 1C even though the hard polymer 20 on the side wall of the metal layer pattern 12a is removed together with the photoresist mask 14a. The reason that only the hard polymer 20 on the side wall of the metal layer pattern 12a is removed while the hard polymer 20 on the side wall of the photoresist mask 14a remains is as follows. Polymers produced when a metal layer, e.g., an aluminum layer, is etched are in the form of $Al_xCl_y$, $Al_xC_y$, $Ti_xC_y$ and the like. Such polymers may adhere to the aluminum, but have greater affinity for a photoresist than the aluminum. Accordingly, the hard polymer such as $Al_xC_y$ or $Ti_xC_y$ adheres to the surface of the photoresist mask 14a much more. Therefore, the hard polymer 20 which has continuously adhered to the side wall of the photoresist mask 14a from the early stage of the etching is not easily removed during the ashing process.

As described above, in case of removing the photoresist mask used during the etching of the metal layer according to the prior art, the hard polymer remains on the metal layer pattern even after the ashing process. Consequently, surface resistance on the metal layer increases and an interlayer insulating film formed on the metal layer is severely contaminated, thereby deteriorating the quality of devices. This make mass production difficult.

SUMMARY OF THE INVENTION

The present invention is therefore directed to a method of removing a photoresist mask which substantially overcomes one or more of the problems due to the limitations and disadvantages of the related art.

It is an object of the present invention to provide a photoresist mask removing method for effectively removing polymer that is a by-product produced during etching of a metal layer.

To achieve the object of the present invention, there is provided a method for removing a photoresist mask and other etching by-products remaining on a semiconductor substrate after a metal layer is dry-etched in an etching chamber. The semiconductor substrate is pretreated by supplying $N_2$ gas without applying RF power to the semiconductor substrate heated up to a predetermined temperature. The photoresist mask and other by-products are then removed by ashing in an ashing chamber. The semiconductor substrate may be conveyed from the etching chamber to the ashing chamber without vacuum break. The pretreating may be performed in the ashing chamber.

The predetermined temperature may be 150–800° C. during the pretreating. The ashing chamber may be maintained at a pressure of 5–9 torr during the pretreating. The pretreating may be carried out for 5–60 seconds. The $N_2$ gas may be supplied at a flow rate of 500–1500 sccm during the pretreating. The metal layer may be an aluminum layer or a tungsten layer. The ashing may be carried out at the same temperature as in the pretreatment step. The pretreating may be carried out at the higher pressure than in the ashing.

In the ashing, a first stabilization may be performed by supplying $H_2O$ gas into the ashing chamber without applying the RF power to the ashing chamber. Passivation may be performed by supplying the $H_2O$ gas into the ashing chamber while applying the RF power to the ashing chamber. A second stabilization may be performed by supplying $N_2$ gas and $O_2$ gas into the ashing chamber without applying the RF power to the ashing chamber. A main ashing may be performed by supplying $N_2$ gas and $O_2$ gas into the ashing chamber while applying the RF power to the ashing chamber.

Alternatively, the ashing may include stabilization by supplying $N_2$ gas and $O_2$ gas into the ashing chamber without applying the RF power to the ashing chamber, and the main ashing by supplying $N_2$ gas and $O_2$ gas into the ashing chamber while applying the RF power to the ashing chamber.

According to the present invention, some process, such as a $N_2$ blowing pretreatment, is performed after etching of a metal layer and prior to an ashing process to facilitate the removal of a polymer layer along with a photoresist mask during the ashing process. Thus, polymers do not remain around a metal layer pattern formed by the etching, thereby preventing deterioration of the quality of devices.

These and other objects of the present invention will become more readily apparent from the detailed description given hereinafter. However, it should be understood that the detailed description and specific examples, while indicating the preferred embodiments of the invention, are given by way of illustration only, since various changes and modifications within the spirit and scope of the invention will become apparent to those skilled in the art from this detailed description.

BRIEF DESCRIPTION OF THE DRAWINGS

The above object and advantages of the present invention will become more apparent by describing in detail preferred embodiments thereof with reference to the attached drawings in which.

DESCRIPTION OF THE PREFERRED EMBODIMENTS

The present invention now will be described more fully with reference to the accompanying drawings, in which preferred embodiments of the invention are shown.

Figure 2A:
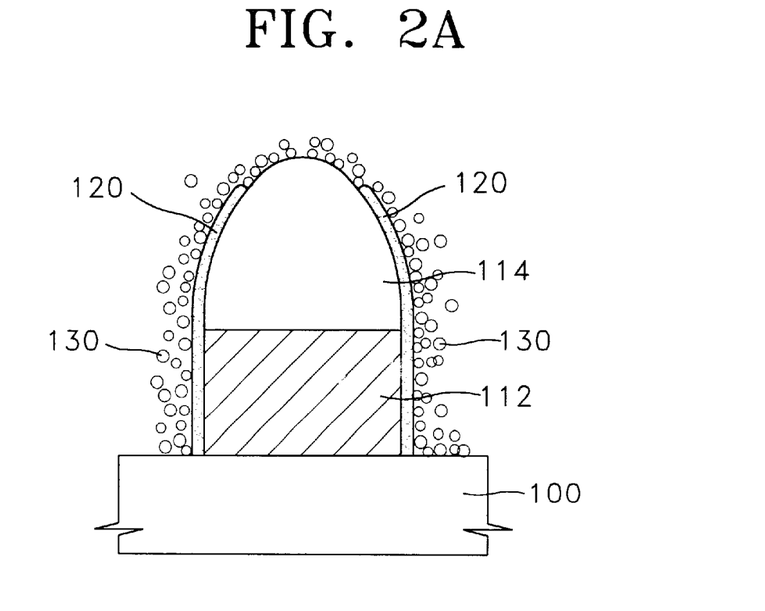
FIGS. 2A, 2B, 2C are sectional views for explaining a method for removing a photoresist mask according to a preferred embodiment of the present invention.
Figure 2B:
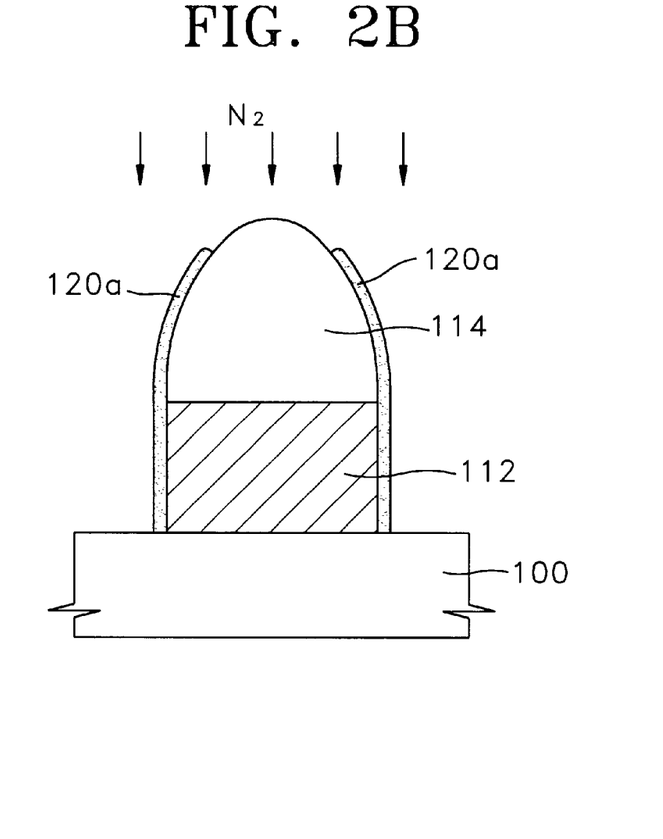
Figure 2C:
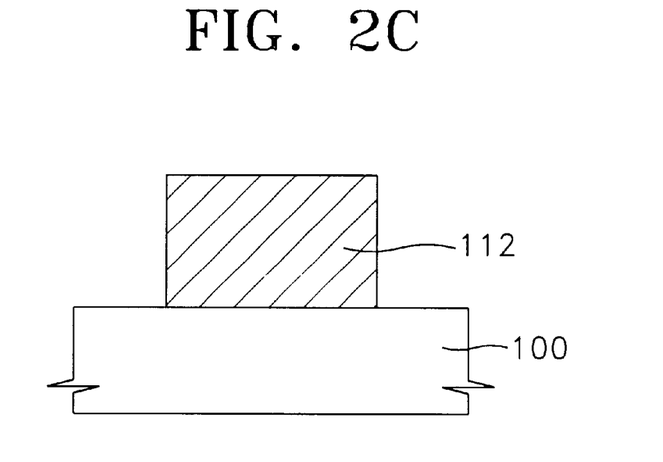

FIGS. 2A through 2C are sectional views in order of process for explaining a method for removing a photoresist mask according to preferred embodiments of the present invention. A first embodiment employs a cluster type of semiconductor fabrication equipment where a high density plasma (HDP) etching chamber and an ashing chamber coexist within the same vacuum space to carry out the etching of a metal layer and the subsequent removing of a photoresist mask. A wafer can be moved from the etching chamber to the ashing chamber without vacuum break. Accordingly, after a wafer undergoes the etching of a metal layer in an etching chamber, the wafer can undergo the removing of a photoresist mask in an ashing chamber in-situ while maintaining vacuum condition.

Referring to FIG. 2A, in the etching chamber of the cluster type of semiconductor fabrication equipment as described above, a metal layer, e.g., an aluminum layer, on a semiconductor substrate 10 is etched using a photoresist mask 114 as an etching mask by an etching method using the HDP, thereby forming a metal layer pattern 112. As a result, a hard polymer layer 120 formed of by-products of the etching adheres to the side wall of the metal layer pattern 112 and the side wall of the photoresist mask 114 on the metal layer pattern 112. Around the hard polymer layer 120 remain the by-products of the etching, which act as sources for forming polymers. The by-products, such as substance 130 (herein after, called a "polymer source 130") typically include, for example, C, Ti, Al, Si, $Al_xCl_y$, $Al_xC_y$, $Ti_xCl_y$ and $Ti_xC_y$, are physically adsorbed to the hard polymer layer 120.

Referring to FIG. 2B, the resultant structure of FIG. 2A is conveyed from the etching chamber via a load lock into the ashing chamber under a vacuum condition. Thereafter, the following process is carried out as a pretreatment process prior to the ashing process in the ashing chamber. Namely, a $N_2$ blowing process is carried out in such a manner of supplying only the $N_2$ gas at a flow rate of 1000 sccm into the ashing chamber at relatively high temperature and pressure, for example, a temperature of 275° C. and a pressure of 9 torr. At this time, Radio Frequency (RF) power supply to the ashing chamber is interrupted. As a result, the hard polymer layer 120 and the physically adsorbed polymer source 130 are prevented from being oxidized in the ashing chamber under the atmosphere of $N_2$ before the ashing process. Furthermore, since $N_2$ gas fluid is supplied in the state where the supply of RF power is interrupted before the ashing process, the physically adsorbed polymer source 130 is physically discharged and removed from the ashing chamber by the flow of the $N_2$ fluid without going through a chemical reaction. After the $N_2$ blowing process, there remains a soft polymer layer 120a on the side wall of the metal layer pattern 112 and the side wall of the photoresist mask 114. The soft polymer layer 120a can be easily removed only by the general ashing process.

Figure 3:
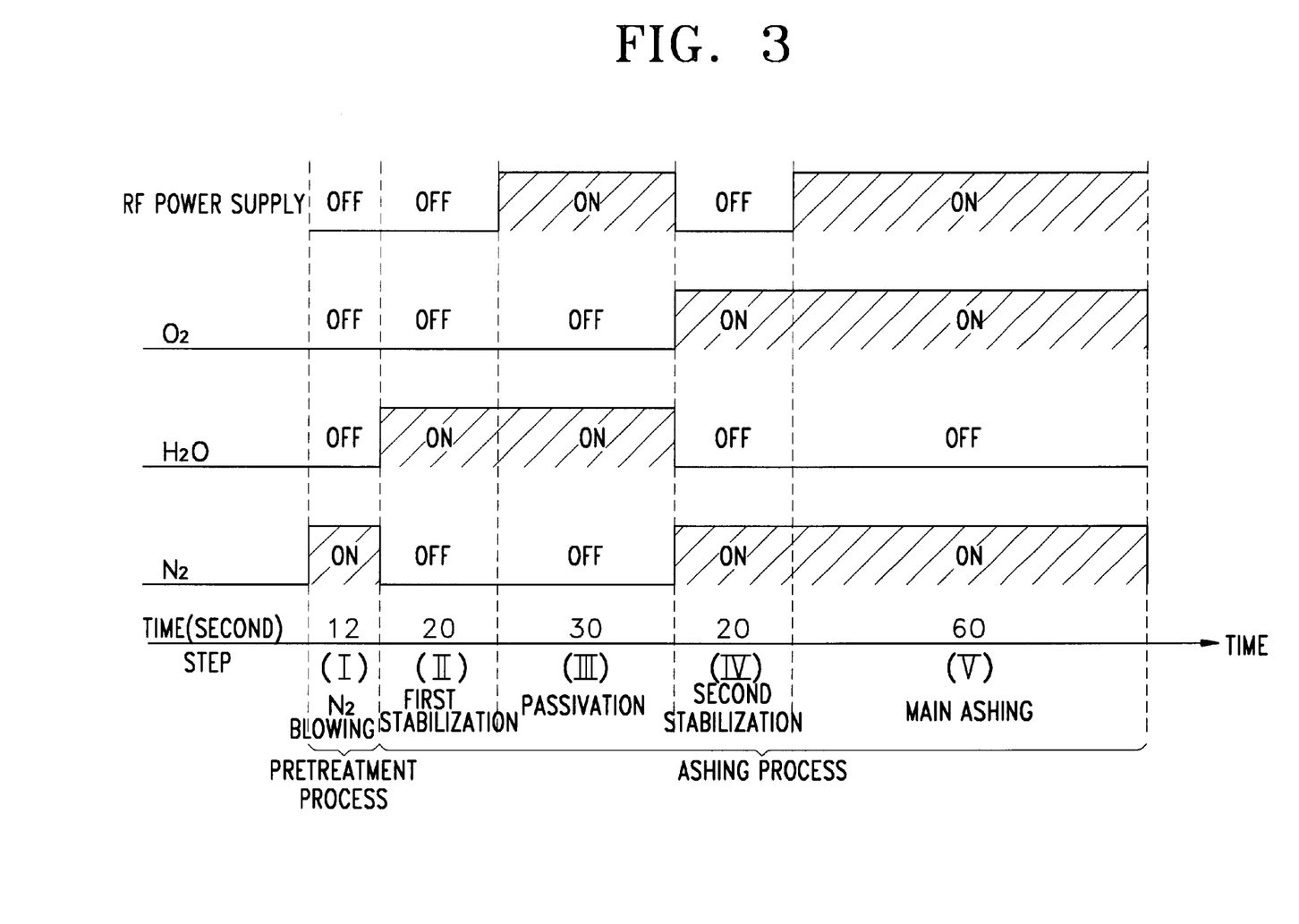
FIG. 3 is a timing chart for explaining a gas pulsing method applied to a photoresist mask removing method according to a first embodiment of the present invention.

FIG. 3 is a timing chart for explaining a gas pulsing method applied to a photoresist mask removing method according to the first embodiment of the present invention. The $N_2$ blowing pretreatment process described with reference to FIG. 2B is indicated in step (I) in FIG. 3.

Referring to FIG. 2C, the ashing process is carried out in the ashing chamber without vacuum break, thereby simultaneously removing the photoresist mask 114 and the soft polymer layer 120a.

Referring to FIG. 3, a specific example of the ashing process will be described in more detail. Primarily, as shown in step (II) of FIG. 3, the semiconductor substrate 100 including the photoresist mask 114 and the soft polymer layer 120a undergoes a first stabilization step in the state where a $H_2O$ gas is supplied, at 750 sccm, into the ashing chamber maintained at a temperature of 275° C. and at a pressure of 3 torr. The first stabilization step is carried out for 20 seconds in the state where the RF power supply is interrupted.

Subsequently, as shown in step (III) of FIG. 3, a passivation step is carried out in such a manner of supplying the $H_2O$ gas, at 750 sccm, into the ashing chamber maintained at a temperature of 275° C. and at a pressure of 3 torr while the RF power supply of 1000 W is being applied. The passivation is carried out to prevent corrosion which may be caused by Cl ions generated from chlorine gases used for the etching of the metal layer. During the passivation, ashing and corrosion inhibiting is simultaneously achieved by $H_2O$ plasma. The passivation step is performed for 30 seconds. According to the result of a test, an ashing rate at the step (III) is about 14,000 Å/min.

Thereafter, as shown in step (IV) of FIG. 3, a second stabilization step is carried out in such a manner of supplying the $N_2$ gas at 400 sccm and an oxygen ($O_2$) gas at 3600 sccm into the ashing chamber maintained at a temperature of 275° C. and at a pressure of 2 torr. The second stabilization step is performed for 20 seconds in the state where the RF power supply is interrupted.

Next, as shown in step (V) of FIG. 3, a main ashing step is carried out in such a manner of supplying the $N_2$ gas at 400 sccm and the $O_2$ gas at 3600 sccm into the ashing chamber maintained at a temperature of 275° C. and at a pressure of 2 torr. The main ashing step is performed for 60 seconds while the RF power of 1000 W is being applied. According to the result of a test, an ashing rate at the step (V) is about 45,300 Å/min. As a result of the ashing process comprising the steps (II) through (V), the photoresist mask 114 and the soft polymer layer 120a are completely removed and the resultant structure as shown in FIG. 2C is obtained.

The specific conditions of the $N_2$ blowing pretreatment process and the ashing process described in the first embodiment are just examples. The temperature, pressure, flow rate, RF power supply and other conditions of the ashing process can be changed in accordance with type of metal layer to be etched and equipment used. The essential feature of the present invention is to perform a process which facilitates removal of etching by-products with the removal of the photoresist, e.g., by performing a $N_2$ blowing pretreatment process without vacuum break, after the etching of the metal layer and before the photoresist removal process.

Figure 4:
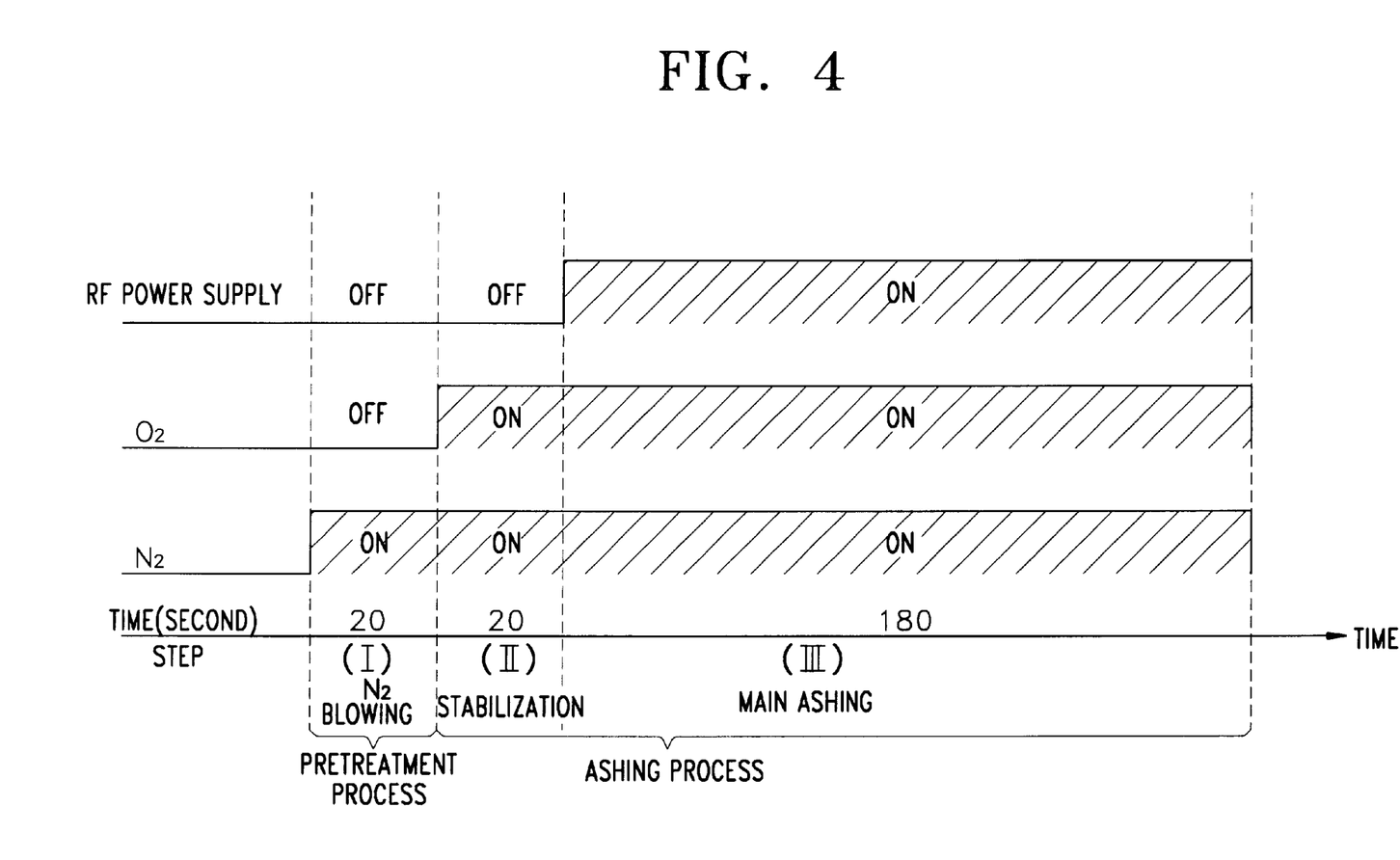
FIG. 4 is a timing chart for explaining a gas pulsing method applied to a photoresist mask removing method according to a second embodiment of the present invention.

FIG. 4 is a timing chart for explaining a specific example of a gas pulsing method applied to the photoresist mask removing method according to a second embodiment of the present invention. Like the first embodiment, the second embodiment employs the cluster type of semiconductor fabrication equipment as described above.

Referring to FIGS. 2A, 2B, 2C and 4, the wafer is conveyed from the etching chamber via the load lock into the ashing chamber without vacuum break in order to remove the hard polymer 120 and the photoresist mask 114 remaining on the metal layer pattern 112 obtained after etching the metal layer, for example, a tungsten layer, in the etching chamber.

Thereafter, as shown in step (I) of FIG. 4, the $N_2$ blowing pretreatment process is carried out in the ashing chamber before the ashing process to physically remove the polymer source 130 which is physically adsorbed around the hard polymer layer 120. The $N_2$ blowing pretreatment process is carried out for 20 seconds while the RF power supply is being interrupted in such a manner of supplying only the $N_2$ gas at the flow rate of 950 sccm into the ashing chamber which is maintained at relatively high temperature and pressure, for example, a temperature of 250° C. and a pressure of 8.5 torr. In result, the polymer source 130 physically adsorbed onto the hard polymer layer 120 is physically discharged and removed by flow of the $N_2$ fluid from the ashing chamber, and by virtue of the $N_2$ atmosphere, there remains a soft polymer layer 120a (FIG. 2B) on the side wall of the metal layer pattern 112 and the side wall of the photoresist mask 114. The soft polymer layer 120a can be easily removed by the general ashing process.

Next, as shown in step (II) of FIG. 4, the semiconductor substrate 100 including the photoresist mask 114 and the soft polymer layer 120a undergoes a stabilization step for introducing the ashing process in the state where the $N_2$ gas is supplied at 350 sccm and the $O_2$ gas is supplied at 3500 sccm into the ashing chamber which is maintained at a temperature of 250° C. and at a pressure of 2 torr. The stabilization step is carried out for 20 seconds in the state where the RF power supply is interrupted.

Subsequently, as shown in step (III) of FIG. 4, the main ashing step is carried out for 180 seconds in such a manner of supplying the $N_2$ gas at 350 sccm and the $O_2$ gas at 3500 sccm into the ashing chamber that is maintained at a temperature of 250° C. and at a pressure of 2 torr while the RF power supply of 1300 W is being applied. If the ashing process comprising the steps (II) and (III) is finished, the photoresist mask 114 and the soft polymer layer 120a are completely removed and the resultant structure as shown in FIG. 2C is obtained.

How effectively hard polymer is removed when removing a photoresist mask according to a method of the present invention is estimated as follows. Primarily, an aluminum layer as a metal layer is etched to form an aluminum layer pattern. To remove the photoresist mask remaining on the aluminum layer pattern, a hard polymer and a polymer source physically adsorbed around the hard polymer, removing the photoresist mask is carried out by the conventional method described above referring to FIGS. 1A through 1C on the one hand. On the other hand, the removing of the photoresist mask is carried out by the method according to the present invention described above referring to FIGS. 2A through 2C and FIG. 3. Thereafter, for each case, analysis of components at a particular portion on the exposed surface of the aluminum layer pattern is made using an auger electron spectroscopy (AES).

Figure 5A:
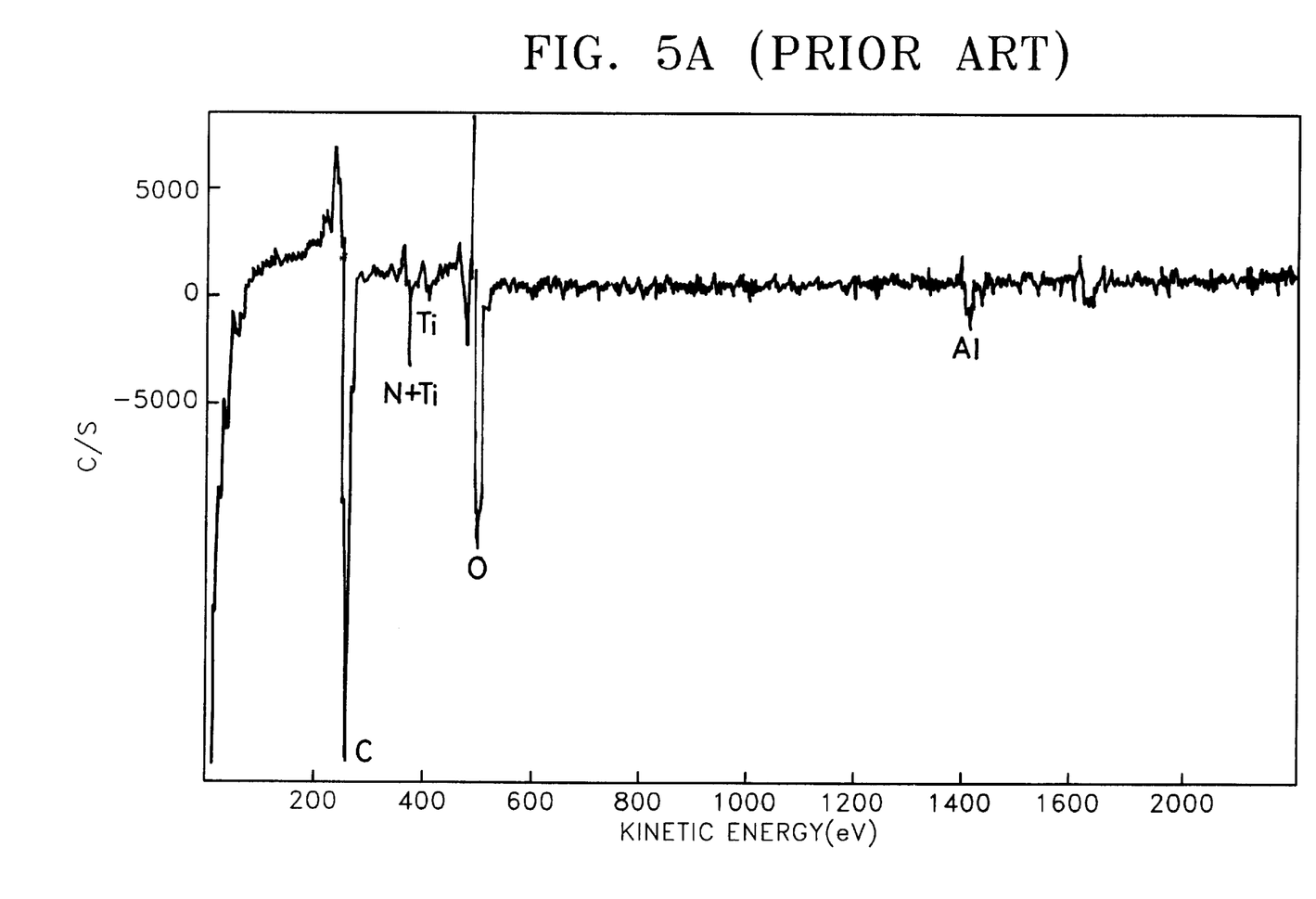
FIG. 5A shows a result of auger electron spectroscopy (AES) analysis in case that the photoresist mask is removed according to the conventional method.
Figure 5B:
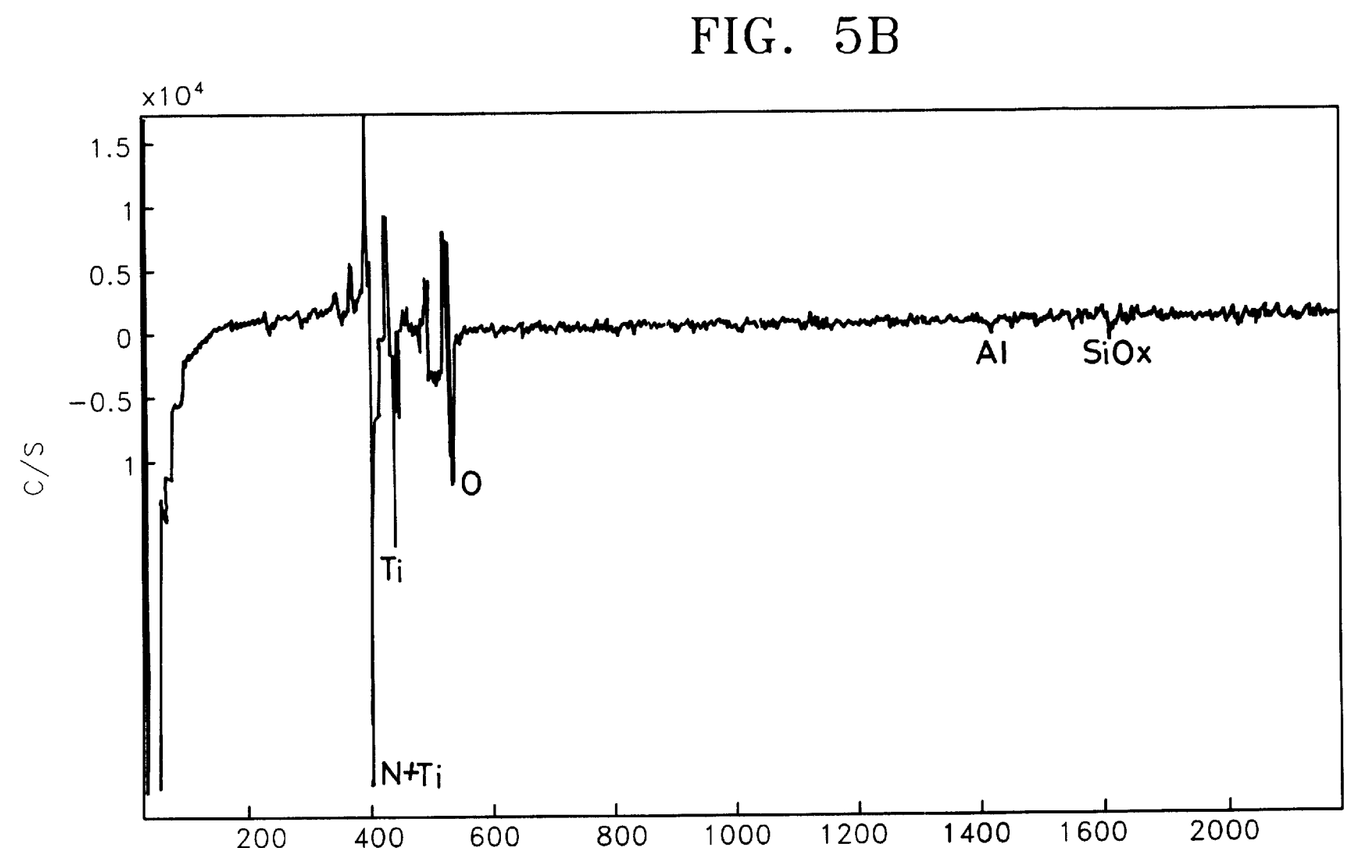
FIG. 5B shows a result of AES analysis in case that the photoresist mask is removed according to the present invention.

FIG. 5A shows a result of the AES analysis in the case that the photoresist mask is removed according to the prior art. FIG. 5B shows a result of the AES analysis in the case that the photoresist mask is removed according to the present invention. In FIGS. 5A and 5B, each vertical axis indicates frequencies of detecting impurities for a second, namely, counter per second (C/S) obtained during the AES analysis.

In the case of employing the conventional method, as shown in FIG. 5A, a great amount of carbon is detected on the surface of the aluminum layer pattern. It also appears that there are substantial amount of oxygen component.

On the other hand, in the case where the $N_2$ blowing process is carried out after the etching of aluminum layer and before the ashing process according to the present invention, as shown in FIG. 5B, carbon is not detected on the surface of the aluminum layer pattern after the photoresist mask is removed. Oxygen component is detected in a remarkably lower content, as compared with the conventional case. Furthermore, in FIG. 5B, the pulse of N+Ti and the pulse of Ti appear larger than in FIG. 5A. This can be construed as indicating that the amount of the oxygen component and polymer remaining on the aluminum layer pattern is smaller than in the conventional case.

As appears from the results of FIG. 5A and FIG. 5B, if the blowing process is carried out using only the $N_2$ gas after the etching of the metal layer and before the ashing process according to the present invention, particles, such as C, Al, Ti, $Al_xCl_y$ and $Al_xC_y$, acting as polymer sources are discharged with the $N_2$ gas from the ashing chamber under the $N_2$ gas atmosphere at a high pressure. Furthermore, oxidation of the particles is suppressed in the atmosphere of $N_2$ gas, thereby changing the hard polymer to the soft polymer. Accordingly, the $N_2$ blowing pretreatment process carried out after the etching of the metal layer and before the ashing process makes it possible for the polymer layer, a by-product of the etching, to be readily removed together with the photoresist mask during the subsequent ashing and strip processes.

As illustrated above, the present invention carries out the $N_2$ blowing pretreatment process before starting the ashing process, instead of carrying out the ashing process starting with the step using a gas containing oxygen immediately after the etching of the metal layer, to suppress oxidation of the polymer which is the by-product of the etching and particles acting as polymer sources and to discharge the physically adsorbed polymer sources from the chamber, thereby softening the polymer layer which remains around the metal layer pattern and the photoresist mask. Accordingly, the photoresist mask and the polymer layer are easily removed during the subsequent ashing process. Consequently, residual polymers do not exist around the metal layer pattern, thereby preventing deterioration of the quality of devices.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method for removing a photoresist mask and other etching by-products remaining on a semiconductor substrate after a metal layer is dry-etched in an etching chamber, the method comprising:

pretreating the semiconductor substrate by supplying $N_2$ gas to the semiconductor substrate without applying RF power to blow the $N_2$ gas on the semiconductor substrate heated up to a temperature sufficient to allow removal of the photoresist mask and other etching by-products by ashing after said pretreating; and removing the photoresist mask and other etching by-products by ashing in an ashing chamber.

2. The method of claim 1, wherein said pretreating occurs in the ashing chamber and further comprising conveying the semiconductor substrate from the etching chamber to an ashing chamber without vacuum break.

3. The method of claim 2, further comprising, during said pretreating, maintaining the ashing chamber at a pressure of 5–9 torr.

4. The method of claim 1, wherein said pretreating occurs in the ashing chamber and further comprises supplying $N_2$ gas into the ashing chamber under a vacuum state.

5. The method of claim 1, wherein, during said pretreating, the predetermined temperature is 150–800° C.

6. The method of claim 1, further comprising performing said pretreating for 5–60 seconds.

7. The method of claim 1, wherein said pretreating includes supplying the $N_2$ gas at a flow rate of 500–1500 sccm.

8. The method of claim 1, wherein the metal layer is an aluminum layer or a tungsten layer.

9. The method of claim 1, further comprising performing said ashing at the predetermined temperature.

10. The method of claim 1, further comprising performing said pretreating at a higher pressure than said ashing.

11. The method of claim 1, wherein said ashing comprises, in the following order:

supplying $H_2O$ gas into the ashing chamber without applying the RF power to the ashing chamber;

supplying $H_2O$ gas into the ashing chamber while applying the RF power to the ashing chamber;

supplying $N_2$ gas and $O_2$ gas into the ashing chamber without applying the RF power to the ashing chamber; and supplying $N_2$ gas and $O_2$ gas into the ashing chamber while applying the RF power to the ashing chamber.

12. The method of claim 1, wherein said ashing comprises, in the following order:

supplying $N_2$ gas and $O_2$ gas into the ashing chamber without applying the RF power to the ashing chamber; and supplying $N_2$ gas and $O_2$ gas into the ashing chamber while applying the RF power to the ashing chamber.

13. A method for removing a photoresist mask and other etching by-products remaining on a semiconductor substrate after a metal layer is dry-etched in an etching chamber, the method comprising:

processing the semiconductor substrate to modify the other etching by-products to facilitate removal of the other etching by-products during ashing; and removing the photoresist mask and the other etching by-products by ashing.

14. The method of claim 13, wherein said processing includes supplying gas to the semiconductor substrate heated up to a temperature, sufficient to allow removal of the photoresist mask and other etching by-products by ashing after said pretreating.

15. The method of claim 14, wherein the gas is $N_2$.

16. The method of claim 13, wherein during said supplying, not applying RF power to the semiconductor substrate.

17. The method of claim 13, wherein when the other etching by-products includes a hard polymer attached to the photoresist mask, said processing includes softening the hard polymer.

18. The method of claim 13, wherein when the other etching by-products includes a polymer source, said processing includes removing the polymer source.

19. The method of claim 13, further comprising maintaining a vacuum state between the etching and said processing.

20. The method of claim 13, further comprising maintaining a vacuum state between said processing and said ashing.

* * * * *